United States Patent [19]

Barina et al.

[11] Patent Number: 5,596,170
[45] Date of Patent: Jan. 21, 1997

[54] FLEXIBLE DOME ELECTRICAL CONTACT

[75] Inventors: Richard M. Barina, Boca Raton; James W. Deiso, III, Boynton Beach, both of Fla.; Arthur A. Kurz, New Vernon; Jeffrey McFadden, Cranford, both of N.J.; Fred L. Murray, Cary, N.C.; William D. Owsley, Boca Raton, Fla.

[73] Assignee: International Business Machines Corporation, Armonk, N.Y.

[21] Appl. No.: 149,571

[22] Filed: Nov. 9, 1993

[51] Int. Cl.⁶ .................................................. H05K 9/00
[52] U.S. Cl. ................................ 174/35 R; 174/35 GC; 220/681; 220/690; 220/693
[58] Field of Search ........................ 174/35 R, 35 GC, 174/35 C, 35 MS; 455/300, 301; 220/677, 680, 681, 690, 693; 439/271, 272, 273, 276, 278, 608, 92, 95, 108; 361/816, 818, 822

[56] References Cited

U.S. PATENT DOCUMENTS

| | | | |
|---|---|---|---|
| 2,747,166 | 5/1956 | Hoffarth | 339/5 |
| 4,155,655 | 9/1978 | Prentice | 174/35 R |
| 4,554,400 | 11/1985 | Schmalzl | 174/35 GC |
| 4,640,979 | 2/1987 | Schmalzl | 174/35 GC |
| 4,780,570 | 10/1988 | Chuck | 174/35 GC |
| 5,015,802 | 5/1991 | Chi | 174/35 GC |
| 5,047,898 | 9/1991 | Cooke et al. | 361/424 |
| 5,053,924 | 10/1991 | Kurgan | 361/424 |
| 5,067,041 | 11/1991 | Cooke et al. | 361/394 |
| 5,163,835 | 11/1992 | Morlion et al. | 439/67 |
| 5,231,246 | 7/1993 | Benson et al. | 174/35 R |
| 5,272,594 | 12/1993 | Delamoreaux | 439/92 X |

*Primary Examiner*—Bot L. Ledynh
*Attorney, Agent, or Firm*—Martin J. McKinley; Michael J. Buchenhorner

[57] ABSTRACT

A flexible electrical contact is formed as a convex dome structure extending from one side of a surrounding structure, with the convex dome structure and the surrounding structure forming an integral metallic structure. The convex dome structure includes a central contact portion and a number of legs extending between the central contact portion and the surrounding structure. Each leg extends radially outward from the central contact portion and circumferentially around part of the central contact portion. A number of convex dome structures of this kind may be part of a removable shield in an electronic enclosure, provided to electrically ground the shield to a conductive frame, reducing the level of RFI (radio frequency interference) emissions from a device. Alternately, a number of convex dome structures may be provided along spring strips fastened to such a shield. In such spring strips, electrical contact may occur between the shield and intermediate positions along the length of the legs.

28 Claims, 3 Drawing Sheets

FLEXIBLE DOME ELECTRICAL CONTACT

BACKGROUND OF THE INVENTION

1. Field of the Invention

This invention relates to a dome-shaped flexible contact structure formed in a sheet metal structure, and more particularly to flexible means for providing electrical contact between adjacent conductive structures shielding radio frequency interference.

2. Background Information

Increased operating speeds, i.e. clock frequencies, in computer systems continually result in increased tendencies of various circuits within such systems to generate electromagnetic energy at radio frequencies. Part of such energy may be emitted from a system to form radio frequency interference (RFI). Because energy of this kind can interfere with communication signals external to a computer system, various governments and agencies place strict limits on the levels of RFI which can be emitted from a system.

Various changes in component technology and design have resulted in electronic circuits which are both faster in operation and lower in electrical power requirements. Such circuits are typically also more sensitive to electromagnetic interference from various external sources.

A traditional method, both for reducing the level of RFI emitted by circuits within a system and for reducing the level of electromagnetic interference allowed to reach such circuits from external sources, is the placement of electrically conductive shielding material around the circuits. This method is proven to be quite effective in accomplishing these objectives when the shielding material forms an effectively continuous envelope around the circuits. However, since physical access to electronic circuits of this kind is often required for upgrading, repairing, or otherwise adjusting the circuits, various means are typically employed to allow the separation of portions of shielding material into two or more structures, with electrical contacts being used to provide conductivity along seams between the separable structures.

The spacing between adjacent contact points along a seam is typically determined in response to the various fundamental and harmonic frequencies of electromagnetic energy generated by the circuits enclosed by the shielding material. As system operating speeds, i.e. clock frequencies, increase, the associated higher frequencies of electromagnetic energy require a decreased spacing between adjacent contact points.

An important example of this kind of shielding is provided in a typical personal computer having a conductive shielding enclosure formed by a metal frame and a by a metal liner within a removable top cover. The use of the metal liner allows the structural and externally visible portions of the top cover to be made from a thermoplastic resin, which can easily provide the structural and aesthetic properties needed in such an application. The top cover must typically be easily removable by the system user to replace various internal components, such as circuit cards, or to upgrade the system by adding new components within spaces provided for this purpose. The main portion of the top cover generally includes sides extending downward to the frame at right and left ends, so that the removal of the cover optimally exposes components within the computer for access. To form an effective shield, the conductive liner within the top cover must be electrically connected to the metal frame along the various seams where the top cover lies adjacent to the frame.

Electrical connections between the top cover and the frame must be easily separable as the cover is removed by the user. These connections must also be reliably re-established as the cover is replaced on the frame. Since adjacent connections must be spaced close together along the seams between the frame and top cover, a large number of such connections are required for an individual cover. It is thus desirable that the contact force established at each such connection should be relatively light to allow the removal and reattachment of the cover without undue effort.

Since variations in the dimensions of the frame and cover, as produced by typical manufacturing processes, may result in variations of several millimeters in the spacing between adjacent features of the frame and top cover, it is further desirable that a system of electrical contacts between the frame and top cover should be flexible enough to provide appropriate contact forces over a wide range of displacement distances.

Furthermore, in many personal computer systems, the combination of frame and top cover is designed so that the top cover is removed as it is pushed toward the rear and then lifted upward. Various structures holding the cover down are cleared by this rearward motion before the cover can be removed upward. The re-installation of the cover follows the reverse of this procedure, with the cover being pushed downward before it is slid forward. Thus, it is particularly desirable that a contact system for providing electrical conductivity between the frame and top cover be configured so that sliding in two directions, perpendicular to each other but parallel to the seam between the frame and top cover, should be accommodated without compromising the structural properties of the contact system.

In the establishment of electrical contact to prevent the emission of RFI, wiping contact is particularly desirable to remove various types of contamination from both surfaces in the contact area as adjacent parts are brought together. The establishment of a normal force without wiping may leave contamination between adjacent contact surfaces, preventing the formation of an effective electrical contact.

In the application of establishing contact between the frame and top cover of an electronics enclosure, as described above, the relative motion between the top cover and frame assembly, occurring as the top cover is installed, is often easily adequate to clean the interface between contact surfaces of the top cover and frame. However, if this interface is formed using springs attached to one side or the other, i.e. to the frame or top cover, in such a way that repeated wiping is not established between the springs and the surface to which they are attached, the electrical contacts between the springs and the surfaces to which they are attached may not be as reliable as the electrical contacts formed at the interface between the springs and the surface on which they slide.

It is therefore desirable that a spring contact system should either be formed as an integral part of a conductive shield, or that a spring contact system should alternately be formed in such a way that relative motion occurs at the interface between the two sections (i.e. the frame and top cover), and also along the surface of attachment between the spring contacts and the shield to which they are attached.

DESCRIPTION OF THE PRIOR ART

A number of contact systems employing formed metal cantilever springs to provide electrical conductivity between adjacent metal shields, used for minimizing the emission of electromagnetic energy forming RFI, may be found in the patent literature. A cantilever spring has a free end, which may be deflected, and a fixed end, which is attached to, or a part of, a structure in turn fixed to one of the shields in this application. A portion of the spring near the free end is typically curved, so that contact is made between an adjacent shield and a convex surface of the spring.

Examples of the use of this type of cantilever spring are found in U.S. Pat. No. 5,015,802, issued to Chi on May 14, 1991, describing a computer casing connector comprising an electrically conductive "U"-shaped body, in which one limb of the "U" has a plurality of snap catches to snap on one piece of a computer casing, and in which the other limb of the "U" has a plurality of resilient arcuate members to contact the other piece of the computer casing when the casing is assembled. Thus, the arcuate members are formed into cantilever spring portions, extending, in one version, away from the fold forming the "U" shape, and, in another version, parallel to this fold. Electrical contact is made either along the convex arcuate surfaces or at the surface of projections formed in these arcuate surfaces.

U.S. Pat. No. 4,544,400, issued to Schmalzl on Nov. 19, 1985, describes a formed and stamped spring contact having a pair of tabs extending as cantilever springs in opposite directions from a central portion which is curved to extend through an aperture in a first planar part. The tabs extend upward and outward from the central portion, with each tab being formed downward to extend through an associated outer aperture in the first planar part and outward to contact a lower surface of the first planar part. Electrical contact is made when a second planar part is brought into contact with the upward extending tabs.

U.S. Pat. No. 4,640,979, issued to Schmalzl on Feb. 3, 1987, describes a contact spring element having a pair of end portions connected by a central portion with a convex configuration. The end portions have hook-like portions, for securing the spring to a planar part as the spring is inserted into a pair of spaced apertures in the planar part, or for engaging an edge of the planar part and a edge of the aperture. The hook end portions can extend in the same direction, and one end portion can include a 180-degree bend to lock the spring on the part. The convex central portion can be a smooth convex curve, or it can be a sharp triangular-shaped bend. While the longitudinal axis of the central portion is formed into a convex shape, the transverse cross section of this portion is rectangular. Electrical contact is made as another planar part is moved against the central portion.

A problem associated with the use of the contact springs of the patents listed above, which can limit the application of the contact design, arises from the fact that, under certain conditions, twisting can occur within the spring. Deflection without such twisting can be expected to occur when a planar part is brought directly down on the contact surface of the spring, i.e. when the planar part is moved directly toward the part on which the spring is mounted. Also, deflection without such twisting can be expected to occur when the planar part is brought into contact with the spring in a direction parallel to longitudinal axis of the spring. However, when the planar part is brought into contact with the spring in a transverse direction, perpendicular to both the direction of deflection and the longitudinal axis of the spring, frictional force between the spring and the planar part may cause twisting of the spring. Such twisting can result in an unsatisfactory increase in electrical contact resistance, as mechanical contact with the planar part is limited to a portion of an edge of the spring. Twisting of the spring can further result in permanent deflection and destruction of the spring, and in forming a jammed condition in which the shields, or planar members cannot be properly brought together.

Such twisting may be alleviated or eliminated by increasing the inherent resistance of the spring portion or tab to twisting. This may be done by increasing the thickness or width of the spring portion, or by decreasing its length. However, such measures also increase the flexural stiffness of the spring, making it unsuitable for use in an application requiring relatively large deflections, a large number of individual contacts, and ease of assembly and disassembly.

In many applications, there is little or no control over the direction in which two shields are brought together. In other applications, parts including shields must be brought together by sequential motions in different directions. For example, in the personal computer cover application described in the previous section, the top cover is brought down, and then forward, on the frame. For such applications, it is particularly desirable to configure an extremely flexible spring contact which has an inherent stability to prevent a twisting mode in which an edge of the spring is presented to a surface of the shield or planar part being contacted by relative motion in one or more direction(s).

Another problem associated with the use of the contact springs described in the patents listed above arises from a lack of relative motion, or wiping contact, between the contact springs and the parts to which they are attached. For example, after the spring strip of U.S. Pat. No. 5,015,802 to Chi is slid over an upturned flange of a frame, there is little or no sliding of the spring strip on the flange during the installation or removal of the top cover of the system. Thus, while significant sliding can be expected to clean the contact spring and top cover surfaces at the interface between the top cover and the springs, contamination may accumulate along the adjacent surfaces of the spring strip and the frame flange.

U.S. Pat. No. 4,780,570, issued to Chuck on Oct. 25, 1988, describes improved EMI/RFI shielding for situations which require heavy duty wiping insertions, such as occurring when a relatively heavy electronic assembly is to be removably inserted in a cabinet. Strips of conductive spring material are riveted to opposite cabinet walls, to be adjacent to the wiping sides of the inserted electronic assembly. Each spring strip contains integral, longitudinally spaced projecting fingers. Specifically, each spring finger is a concave curved cantilever spring extending inward through a slotted part of the material from which it is formed. Electrical contact with the inserted electronic assembly is maintained part of the way along the length of each spring finger, where the spring finger extends inward farthest inward, as held in its deflected state by the inserted electronic assembly. As the spring fingers on each side of the electronic assembly are deflected by the insertion of the assembly therebetween, the unattached end of each spring finger is pushed into contact with the adjacent inner surface of the cabinet wall to which the spring strip is attached.

In the spring strip described by Chuck, all of the spring fingers extend in a common direction, establishing preferred, opposite directions for the installation and removal of the electronic assembly.

One particular problem with the use of spring strips of this kind is the level of increase in the stiffness of each spring tab as it is deflected by the insertion of the electronic assembly. After contact is established between the tip as a spring tab and the underlying cabinet surface, the spring tab, with its convex shape, forms an arch between its attachment to the spring material from which it is formed and its tip contact with the cabinet surface. Thus, the spring tab resists continued deflection partly in the way that an arch bridge resists deflection, as deflection of the spring tab results in the development of compressive stresses along the tab. Relative motion of the tip of the spring tab, sliding on the underlying cabinet surface, must occur to allow substantial deflection of the spring. The high forces and stress levels associated with this type of deflection also may result in breakage, twisting, or other forms of permanent deflection of the spring tabs.

In the application of providing electrical contact between the top cover and frame of a personal computer, a large number of electrical contact points is needed along the relatively long interface between shielding members. This increase in stiffness of the spring tabs during the assembly process, as described in the preceding paragraph, indicates that the use of the spring strip described by Chuck would require the application of extraordinary force to assemble the top cover to the frame. A method is needed for providing a wiping relative motion between flexible spring tabs and the shield or cabinet wall to which they are mounted, while continuing to allow deflection at relatively low levels of force and stress.

Another example of using a cantilever spring tab is found in U.S. Pat. No. 4,115,655, issued to Prentice on Sep. 19, 1978, in which a spring strip is described for making electrical connections between shields and a slotted extrusion forming a corner of an enclosure. The spring strip extends along a portion of a slot into which an edge of a shield also extends. The spring strip includes a number of pointed features to engage an edge of the slot, and a number of curved cantilever spring members to make contact with a corner of the shield edge.

While some twisting occurs in the Prentice cantilever spring tabs, due to contact at an angle with an edge of the shield, this twisting is controlled by the restriction of movement of the shield within the slot of the extrusion. However, the specialized nature of the Prentice invention means that it cannot be directly used in many applications, such as the electrical grounding to a top cover shield, as described above, in a personal computer.

SUMMARY OF THE INVENTION

In accordance with one aspect of the invention, there is provided electrical apparatus forming an integral metallic structure, including a central contact portion, a surrounding structure, and a number of legs. The surrounding structure extends around the central contact portion and away from the central contact portion. The legs, which are angularly spaced apart around the central contact portion, extend between the central contact portion and the surrounding structure. Each leg extends radially outward from the central contact portion and circumferentially partially around the central contact portion. The legs and the central contact portion extend in a convex shape from one side of the surrounding structure.

BRIEF DESCRIPTION OF THE DRAWINGS

Preferred variations or embodiments of the subject invention are hereafter described, with specific reference being made to the following Figures, in which.

DETAILED DESCRIPTION

Figure 1:
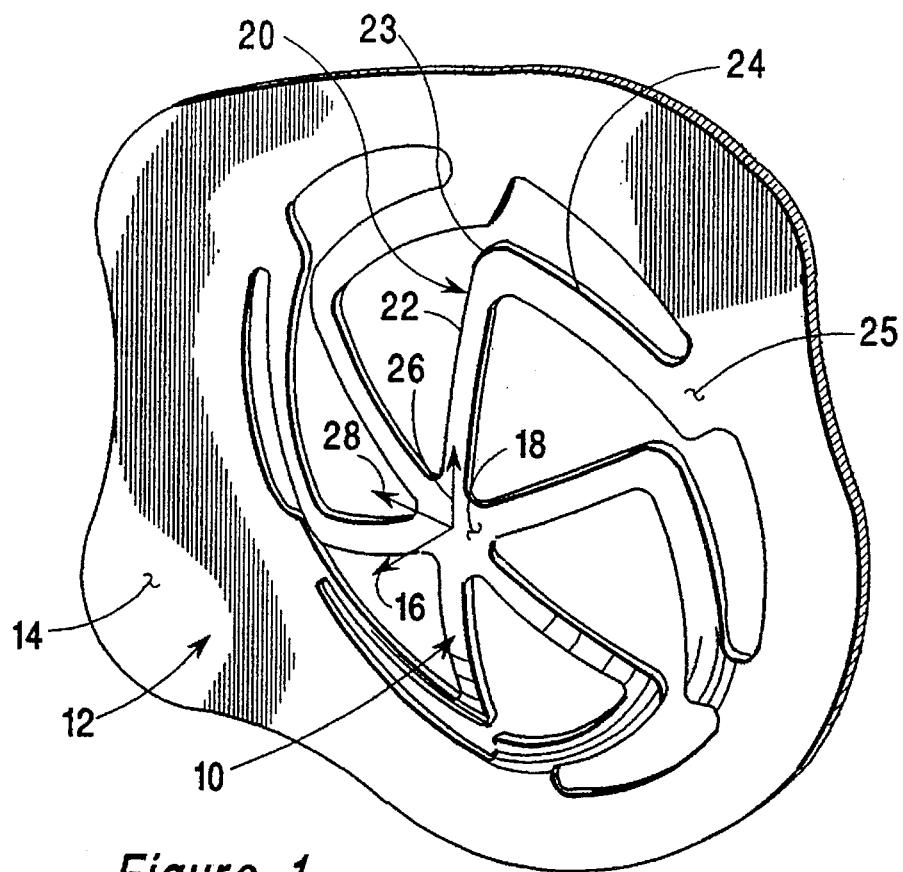
FIG. 1 is an isometric view of an individual dome contact structure formed, in accordance with the present invention, as an integral part of a metal shield.

The general shape of an electrical contact built in accordance with an embodiment of this invention may be understood from the following description, along with particular reference to FIG. 1, which shows a single dome contact surface 10 formed as an integral part of a metal sheet 12. This metal shield 12 in turn forms a conductive structure extending both around and outwardly away from dome contact structure 10. Dome contact structure 10, which has a generally convex shape, protruding from the generally flat surface of a surrounding portion 14 of sheet 12 in the direction of arrow 16, includes a central contact portion 18 from which a number of legs 20 extend outward to join surrounding portion 14. Since central contact portion 18 protrudes the farthest from surrounding portion 14, contact with an adjacent part is established at central contact portion 18. Each leg 20 includes a radial portion 22, extending outward from central contact portion 18 to an intermediate transition section 23, and a circumferential portion 24, extending circumferentially from intermediate section 23 to an inner limit of surrounding portion 14. Circumferential portions 24 extend in a common angular direction around central contact portion 18. Each circumferential portion 24 may also extend radially outward in a spiral, to be connected to surrounding portion 14 by an outer transition section 25.

The inner and outer surfaces of dome contact structure 10 are formed into convex shapes, which may be the shapes of spherical segments. Other convex shapes may be used as well; for example, the inner and outer surfaces of central contact portion 18 may be formed into the shapes of spherical segments, while the inner and outer surfaces of legs 22 are formed into the shapes of truncated cones.

The depression of central contact portion 18, in the direction opposite arrow 16, by an adjacent surface (not shown) results in the establishment of a normal force, in the direction of arrow 16, by deflections occurring within dome contact structure 10. Such depression results in the occurrence of both torsional and flexural deflections along radial portion 22 and circumferential portion 24 of each leg 20. (Torsional deflections are considered herein to occur as a portion of a leg is twisted about its longitudinal axis, while flexural deflections are considered to occur as a longitudinal axis of a portion of a leg is curved by the application of external forces.) In each leg 20, radial portion 22 and circumferential portion 24 cooperate to transfer these deflections to one another, with the torsional deflection of each such section arising partly as a result of the flexural deflection of the other section, while the flexural deflection of each section arises partly as a result of the torsional deflection of the other section. The torsional deflections within legs 22 are particularly effective in limiting, to reasonable levels, the force produced by the inward deflection of central contact portion 18.

The various legs 20 of dome contact structure 10 also cooperate to share the external force loading applied to central contact portion 18 and to stabilize the angular relationship between central contact portion 18 and surrounding portion 14 under conditions of external loading. If an external force is applied to the center of central contact portion 18, in a direction opposite arrow 16, by symmetry there is no angular deflection of central contact portion 18. When other loading conditions occur, the angular deflection of central contact portion 18, while it occurs to some extent, is resisted by the presence of legs 22 in a symmetrical pattern around portion 18.

Thus, since the legs 22 include circumferentially-directed portions 24, diametrically opposed legs can be used to support central contact portion 18 without forming an arch structure which resists deflections in the manner or an arch bridge. That is, the deflection of central contact portion 18 is opposed by the development of flexural and torsional stress patterns within the legs 22, instead of by the development of a compressive stress pattern within an arch. This difference is particularly important, since the arch is well known for stiffness as well as strength. High levels of stiffness are avoided to permit a low-force flexible contact spring function.

Figure 2:
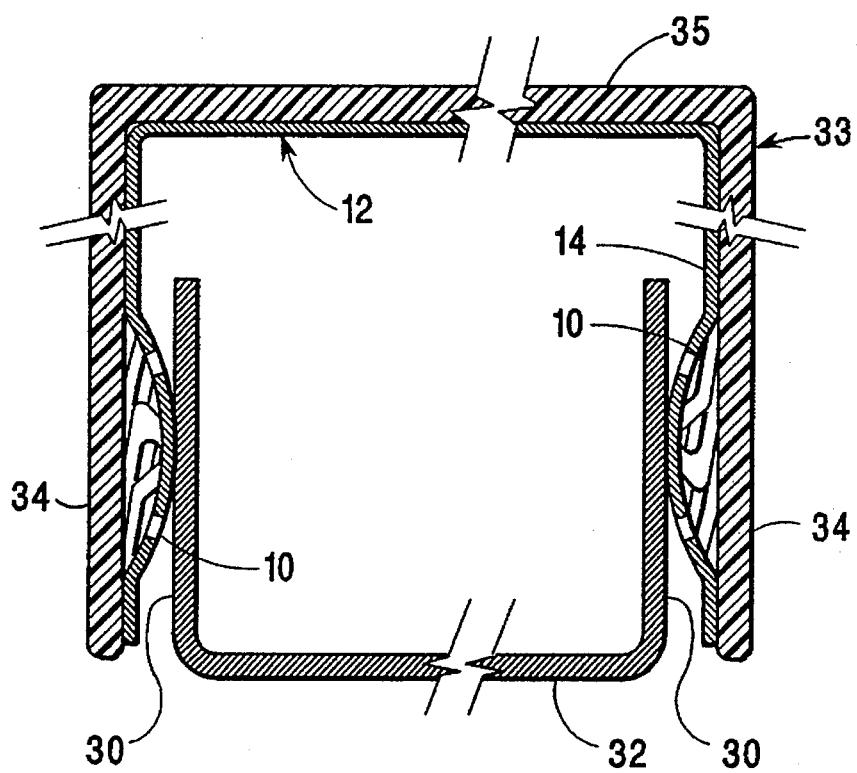
FIG. 2 is a fragmentary transverse cross-sectional elevation of an enclosure including, along lower edges, a number of the dome contact structures of FIG. 1.

FIG. 2 is a fragmentary transverse cross-sectional view of an enclosure providing shielding for enclosed electronic circuits (not shown). In this view, the enclosure has been broken to show particularly the contact structures extending from front to rear along the lower right and left corners of the enclosure. A number of dome contact structures 10 are used to provide electrical conductivity between adjacent parallel metallic structures, such as a flange 30 of a frame 32 and a surrounding portion 14 of a shield 12. For example, frame 32 may be a metal frame forming a lower structure of a personal computer, while shield 12 is a metallic liner fastened inside a non-conductive top cover 34 of the personal computer. With this construction, the casing of a personal computer is made generally from a "U"-shaped frame 32 having upstanding portions (not shown) forming the front and back surfaces of the casing, and a "U"-shaped cover 33, fastened atop frame 32, having sides 34 extending downward from an upper portion 35 to form the right and left sides of the casing. A flange 30 extends from front to rear at each side of frame 32. The use of a conductive liner 12 allows top cover 33 to be composed of thermoplastic resin materials having an attractive combination of aesthetic and structural properties, while providing, through liner 12, shielding to reduce RFI emissions from the personal computer. A number of dome contact structures 10 are preferably aligned in a spaced-apart relationship along a lower edge of each side of shield 12, extending from the front to rear of cover side 34, with shield 12 thus being grounded on each side to a flange 30 of frame 32. Frame 32 is in turn electrically grounded by conventional attachment means (not shown) to the ground wire of a standard three-wire line cord. An appropriately small spacing is provided between adjacent dome contact structures 10, to minimize RFI emissions through the use of effectively grounded shielding.

The installation of top cover 33 over frame 30 results in the application, to each dome contact structure 10, of a central normal force in the direction opposite arrow 16, together with the simultaneous application of a frictional force in the direction of arrow 26 or 28 (with all arrows being shown in FIG. 1). In fact, a frictional force of this kind may be applied to central contact portion 18 at any direction perpendicular to arrow 16, depending on the direction of relative motion between top cover 33 and frame 32 during the installation or removal of the top cover. While the application of frictional forces in this way results in some angular displacement of central contact surface 28 relative to surrounding portion 14, such angular deflection is resisted by the various legs 20 arrayed around the central contact surface. As a practical matter, such angular deflection may be controlled to an extent that contact occurs between a spherical surface of central contact portion 18 and the flat surface of flange 30. That is, contact between the various edges of dome contact structure 10 and the flat surface of flange 30 is prevented by the angular stability associated with the pattern of legs 22.

In this way, the use of the present invention has an advantage over the use of cantilever spring tabs, as proposed in U.S. Pat. No. 5,015,802 to Chi and U.S. Pat. No. 4,544,400 to Schmalzl, and over the use of a convex spring tab, as proposed in U.S. Pat. No. 4,640,979 to Schmalzl. The prior art devices of these patents lack the stabilizing influence of additional legs extending outward at acute angles to one another, so that contact surfaces may be much more easily twisted by a frictional force having a component perpendicular to the longitudinal axis of the cantilever or convex spring tab. Such twisting can result in electrical contact through an edge of the tab, which has inadequate surface area to prevent the emission of RFI, in permanent deflection and damage to the spring tab, and in jamming a twisted spring tab to prevent assembly or disassembly.

This advantage of the present invention is particularly desirable in the application shown in FIG. 2, where the direction of the friction force is determined by the direction in which top cover 33 is slid onto frame 32. In many personal computer units of the background art, the top cover must be slid backward and then upward for removal, and downward and then forward for re-installation, so that the frictional force can be expected to be applied at various times from four mutually perpendicular directions. In other applications, the direction of motion between shield 12 and flange 30 is not defined, so that frictional forces can be expected to be applied in any direction.

The use of the version of the present invention shown in FIG. 2 has an advantage over the use of cantilever spring tabs, as proposed in U.S. Pat. No. 5,015,802 to Chi and U.S. Pat. No. 4,544,400 to Schmalzl, and over the use of a convex spring tab, as proposed in U.S. Pat. No. 4,640,979 to Schmalzl, in that the spring structures are formed as integral parts of shield 12, instead of as parts of spring strips fastened to a shield. Thus, it is not necessary to be concerned about the quality of an electrical contact between the spring structures and a shield to which they are fastened.

Figure 3:
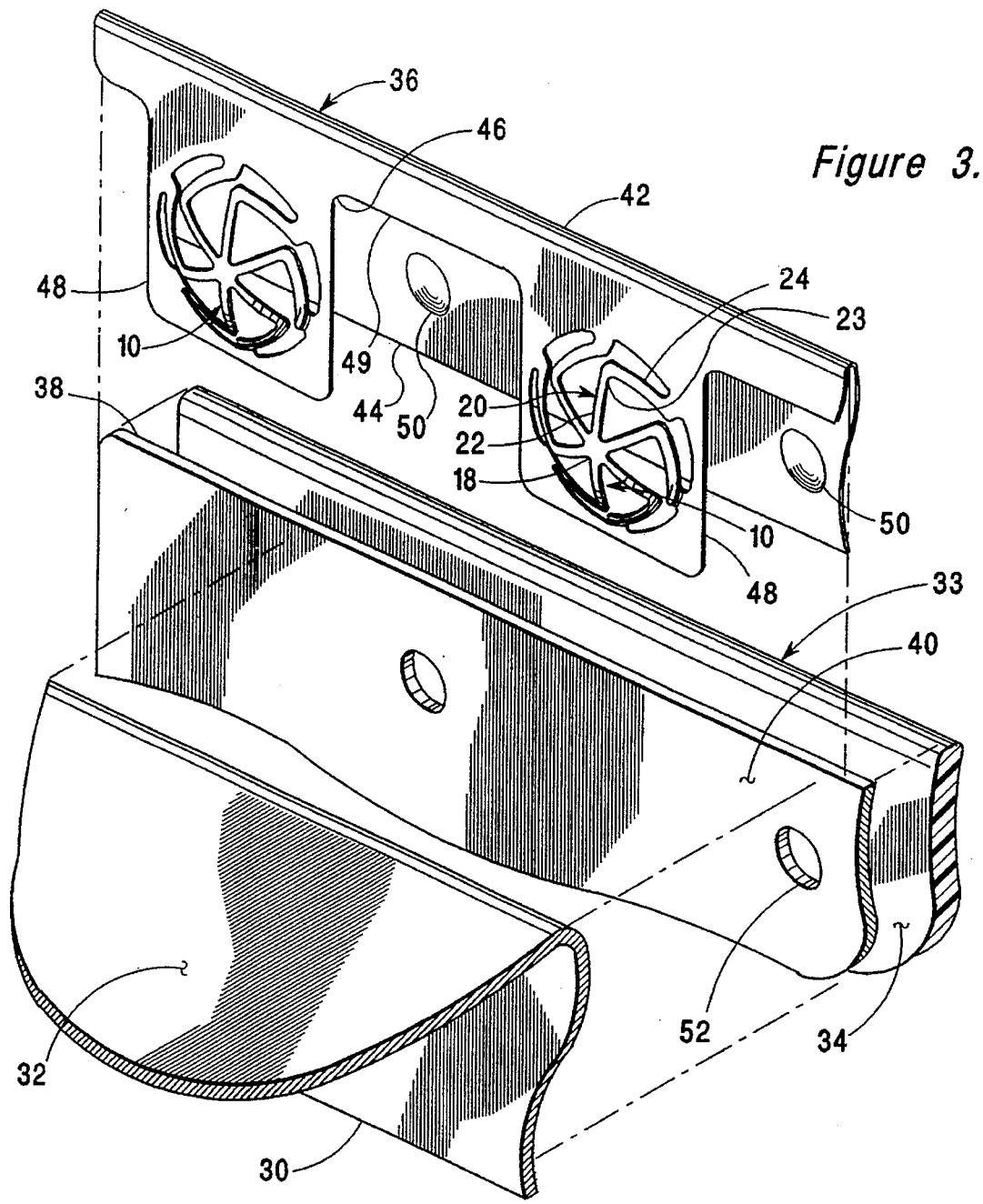
FIG. 3 is an exploded isometric view of a portion of an enclosure including a number of dome contact structures formed, in accordance with an alternate method of the present invention, as integral parts of a metal spring strip.

Referring to FIG. 3, a number of dome contact structures 10 may alternately be placed along one side of a spring strip 36, configured, for example, for attachment along an edge 38 of a shield 40. The application of this alternative configuration may be as described in reference to FIG. 2, with shield 40 being a conductive liner fastened within the non-conductive cover 33 of a personal computer, and with dome contact structures 10 being used to provide electrical connection to flange 30 of frame 32. In this application, FIG. 3 shows various components in an inverted orientation as viewed from above.

Spring strip 36 is basically a "U"-shaped strip, being formed along a central region 42 into an outer side 44 and an inner side 46. Each dome contact structure 10 forms an integral part of a tab 48, which extends as a part of inner side 46. Between tabs 48 outer side 44 extends as a lip 49. The positioning of spring strip 36 and its attachment to shield 40 is facilitated by a number of dimples 50, formed in outer side 44 to extend into corresponding holes 52 in shield 40. In this application, there may be, for example, fifteen dome contact structures 10 spaced along a spring strip 36 at each side 34 of top cover 33.

Thus, spring strip 36 is pushed onto edge 38 of shield 40, to be held in place by the engagement of dimples 50 with holes 52. Shield 40 may be fastened to the inner surfaces of top cover 33 through the use of a number of well known techniques, either before or after the assembly of spring strip 36 to shield 40. After the assembly of the entire system, e.g. after the installation of top cover 33 on frame 32, the force exerted on each of the dome contact structures 10 by flange 30 is resisted by a force exerted in turn on shield 40 by the flat portion of each of the tabs 48. In this way, efficient means are provided for carrying radio-frequency electrical signals between shield 40 and frame 32.

If spring strip 36 becomes damaged, its removal for subsequent replacement is facilitated by the placement of dimples 50 on outer side 44 between tabs 48. In this way, a sharp tool, extending into each hole 52, may be used to push each dimple 50 out of engagement with the hole 52.

The advantages of the alternative version shown in FIG. 3, relative to prior art methods, are as described above in reference to the method shown in FIGS. 1 and 2. While this alternative version, when compared to the version of FIGS. 1 and 2, has the disadvantage of requiring an additional part in the form of spring strip 36, an advantage is achieved in that a different material, having a different hardness and a different thickness, can be used to form the spring dome contact structures 10 of spring strip 36. In many applications, it is desirable to form spring strip 36 from relatively hard and thin sheet metal, while shield 40 is formed from relatively soft and thick sheet metal. Either or both spring strip 36 and/or shield 40 may be plated to provide suitable surface properties. The use of relatively thin sheet metal for spring strip 36 helps to assure that the deflection forces in spring dome contact structures 10 are low enough to allow relatively easy assembly of parts making contact through a large number of such structures 10. The use of relatively hard sheet metal for spring strip 36 helps to assure that the deflections of spring dome contact structures 10 will be within the elastic range of the material, so that contact forces will be maintained as the materially is not permanently deflected. Stainless steel sheet material having an appropriate hardness is a good choice for spring strip 36 in many applications. Thus, the alternative version of FIG. 3 is used to provide a thin, flexible spring attached to a relatively thick bracket or metal plate.

Figure 3A:
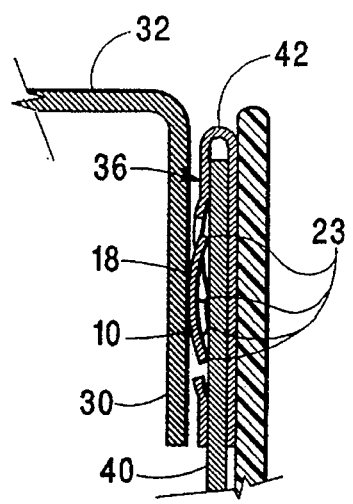
FIG. 3a is a partial transverse cross-sectional elevation of the enclosure of FIG. 3.

Referring to FIG. 3a, the dome contact structures 10 of spring strip 36 may be configured so that, whenever a deflection of central contact portion 18 occurs, within the range of deflections expected to occur due to allowable variations in the dimensions of surrounding parts, the intermediate transition sections 23 of legs 20 contact the underlying surface of shield 40. This type of deformation occurs because, within each leg 20, as a normal force is applied to central contact portion 18, the circumferential portion 24 (shown in FIG. 3) is sufficiently flexible for local deformation to close the gap between intermediate transition section 23 and the underlying surface of shield 40 before another part of dome contact structure 10 contacts this underlying surface. This configuration provides contact and relative motion between relatively sharp edges along intermediate transition sections 23 and the surface of shield 40. The relative motion occurs due to flexure and twisting within the legs 20 after contact is made between transition sections 23 and the underlying surface of shield 40. Both twisting and flexure can increase with continued deflection after contact is made between the transition sections 23 and the underlying surfaces.

Thus, an advantage is gained through the use of the version of the present invention shown in FIG. 3, when compared to using the spring strip described in U.S. Pat. No. 4,780,750 to Chuck, in that the spring, upon contact with the underlying surface due to flexure, is not converted into a structure which resists further deflection partially in the manner of an arch bridge. With the present invention, this type of contact occurs at an intermediate point, after which twisting, rather than compression, provides a dominate form of deflection, along with flexure.

Figure 4:
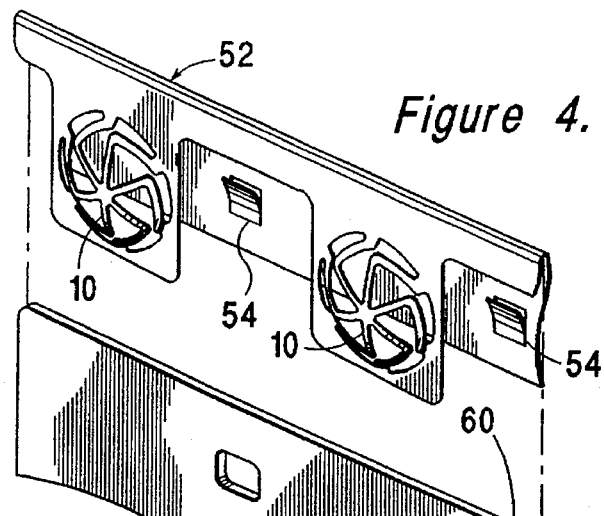
FIG. 4 is an exploded isometric view of a portion of an enclosure, showing alternate means for attaching a spring strip, having dome contact structures of the present invention, to an enclosure shield.

FIG. 4 shows an alternative spring strip 52, having a number of tabs 54, which are lanced and formed inward to engage associated slots 56 in a shield 58. As spring strip 52, which is otherwise similar to spring strip 36, is pushed into place over edge 60 of shield 58, tabs 54 are deflected outward, into a flattened condition, to return inward within slots 56, holding strip 52 in place on shield 58.

Figure 5:
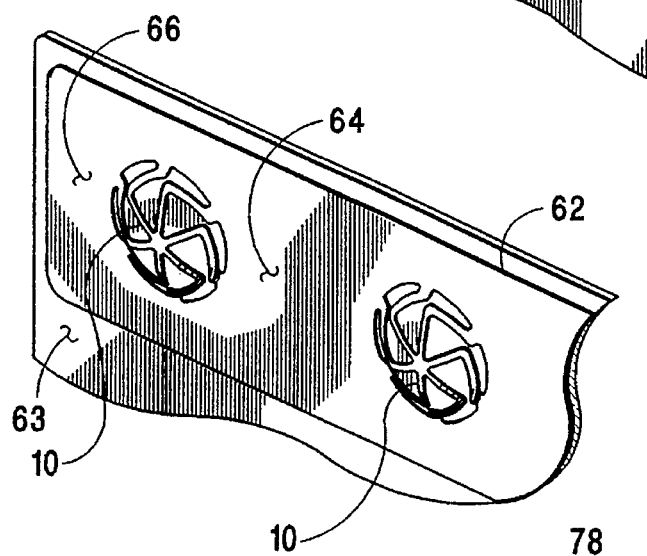
FIG. 5 is an isometric view of an alternative spring strip with dome contact structures of the present invention, attached to a metal shield by welding.

FIG. 5 shows another alternative spring strip 62, which is welded to a shield 63. For example, a resistance welds may be placed in the regions 64 between adjacent dome contact structures 10 and in the regions 66 at each end of strip 62. With this method, the "U"-shaped form of spring strips 36 and 52 is not required.

Figure 6:
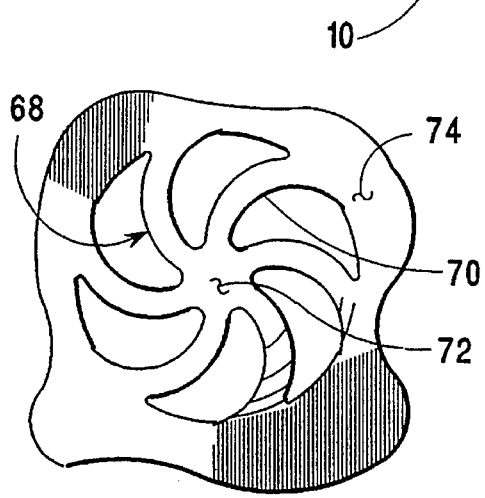
FIG. 6 is an elevational view of an individual dome contact structure having legs shaped in accordance with a variation of the present invention.
Figure 7:
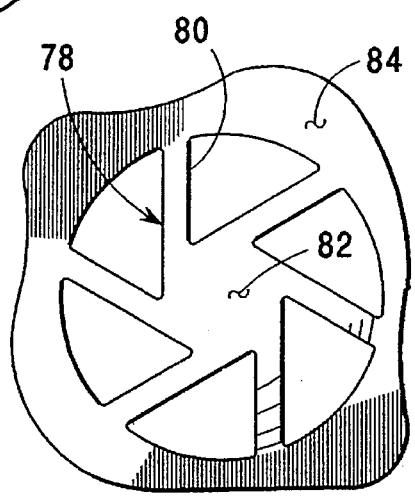
FIG. 7 is an elevational view of an individual dome contact structure having legs shaped in accordance with a second variation of the present invention.

The preceding discussion, relating particularly to FIGS. 1 and 2, describes a dome contact structure 10 having six legs 20, each of which includes a radial portion 22 and a distinct circumferential portion 24. FIGS. 6 and 7 show alternative shapes that can be used for legs in alternative versions of dome contact structures built in accordance with the present invention.

Referring to FIG. 6, in an alternative dome contact structure 68, each leg 70 may be formed into a smooth, spiral curve including the features defining separate portions of leg 22 (shown in FIG. 1). In the example shown, each leg 70 extends radially from a central contact region 72, with a circumferential component of the direction of the leg 70 increasing as the leg extends to a surrounding portion 74.

Referring to FIG. 7, in a second alternative dome contact structure 78, a number of legs 80, extending tangentially from an outer part of a central contact region 82, are directed in a combination of radial and circumferential directions between central contact region 82 and a surrounding portion 84.

The configurations of FIGS. 6 and 7 are formed into convex dome shapes as previously described in reference to FIGS. 1 and 2. When the central contact region 72 or 82 is depressed, a combination of flexural and torsional deflections is produced in the surrounding legs 70 or 80. Thus, these configurations can be made to deflect under relatively light loading, as required in the types of application described above.

While the preceding discussion has been limited to six legs spaced at equal angles around a central contact region, it is understood that other numbers of legs can be used as well. While the symmetrical positioning of these legs helps prevent the rotational deflection of the central contact region under the condition of loading with a normal force, the legs need not be symmetrically positioned.

While the invention has been described in its preferred forms or embodiments with some degree of particularity, it is understood that this description has been given only by way of example and that numerous changes in the details of construction, fabrication and use, including the combination and arrangement of parts, may be made without departing from the spirit and scope of the invention.

What is claimed is:

1. Electrical contact apparatus comprising:

a central contact portion;

a surrounding structure extending around said central contact portion and away from said central contact portion; and a plurality of legs, angularly spaced apart around said central contact portion, extending between said central contact portion and said surrounding structure, each of said legs of said plurality of legs extending radially outward from said central contact portion and circumferentially partially around said central contact portion, said plurality of legs forming an integral metallic structure with said surrounding structure and with said central contact portion, said plurality of legs and said central contact portion extending in a convex shape from one side of said surrounding structure.

2. The apparatus of claim 1, wherein each of said legs of said plurality of legs includes:

a radial portion extending from said central contact portion; and a circumferential portion extending, between said radial portion and said surrounding structure, said circumferential portion of each of said legs of said plurality of legs extending in a common angular direction between said radial portion and said surrounding structure.

3. The apparatus of claim 1, wherein each of said legs of said plurality of legs extends outwardly in a spiral, from a radially extending inner end connected with said central contact portion to an outer end, extending radially and circumferentially, connected to said surrounding structure.

4. The apparatus of claim 1, wherein each of said legs of said plurality of legs extends outwardly from said central contact portion as a straight line tangent to an outer part of said central contact portion.

5. The apparatus of claim 1, wherein said central portion, said plurality of legs, and said surrounding structure have similar thicknesses, being integral parts of a formed metal sheet.

6. The apparatus of claim 5, wherein said surrounding structure forms a portion of an envelope to be placed around an electronic apparatus to prevent the passage of electromagnetic energy.

7. The apparatus of claim 5, wherein said surrounding structure includes means for attachment to a conductive plate.

8. The apparatus of claim 7, wherein said means for attachment comprises a "U"-shaped structure, having first and second sides extending from a folded region, said first and second sides being spaced apart to permit installation of said surrounding structure over an edge of said conductive plate, with each of said legs of said plurality of legs and said central contact region extending in a convex shape away from said first side as a part of said second side.

9. The apparatus of claim 8, wherein said first side includes a latching portion extending toward said second side for engagement with a feature of said conductive plate.

10. The apparatus of claim 1, wherein each of said legs of said plurality of legs includes an intermediate contact portion, intermediately placed along each of said legs of said plurality of legs, each said intermediate contact portion being displaced away from said surrounding structure by said convex shape, said intermediate contact portions being moved through said surrounding structure as an increasing normal force is applied to said central contact portion before any other portions of each of said legs of said plurality of legs are moved through said surrounding structure and before said central contact portion is moved through said surrounding structure.

11. The apparatus of claim 10:

wherein each of said legs of said plurality of legs includes a radially directed portion extending radially outward from said central contact portion and a circumferentially directed portion extending between said radially directed portion and said surrounding structure; and wherein each said intermediate contact portion joins each said radially directed portion with each said circumferentially directed portion.

12. A formed metallic spring strip for providing electrical contact between first and second adjacently disposed conductive structures, wherein said spring strip comprises:

a folded region;

a first side extending from said folded region;

a second side extending from said folded region in a common direction with said first side and in a spaced-apart relationship with said first side, said second side including a plurality of dome-shaped contact structures, each of said dome-shaped contact structures extending away from said first side in a convex shape, each of said dome-shaped contact structures including a central contact portion, and a plurality of legs, angularly spaced apart around said central contact portion, extending between said central contact portion and a surrounding part of said second side, each of said legs of said plurality of legs extending radially outward from said central contact portion and circumferentially partially around said central contact portion, said central contact portion and said plurality Of legs forming integral portions of said spring strip.

13. The spring strip of claim 12, wherein each of said legs of said plurality of legs includes:

a radial portion extending from said central contact portion; and a circumferential portion extending between said radial portion and said surrounding part, each said circumferential portion of each of said legs of said plurality of legs within each said dome-shaped contact structure extending in a common angular direction between each said radial portion and said surrounding part.

14. The spring strip of claim 12, wherein said first side includes a latching portion extending toward said second side for engagement with an aperture in said first adjacently disposed conductive structure.

15. The spring strip of claim 14, wherein said latching portion includes a convex shaped dimple.

16. The spring strip of claim 14, wherein said latching portion comprises a flexible tab extending from an outer part of said first side toward said folded region and toward said second side.

17. The spring strip of claim 12:

wherein said first side includes a plurality of latching portions extending toward said second side for engagement with apertures in said first adjacently disposed conductive surface;

wherein said second side includes a lip portion extending from said folded region and a plurality of tab portions extending from said lip portion, said plurality of tab portions being individually disposed between said latching portions; and wherein said dome-shaped contact structures are within said plurality of tab portions.

18. The apparatus of claim 12, wherein each of said legs of said plurality of legs includes an intermediate contact portion, intermediately placed along each said leg of said plurality of legs, said intermediate contact portion being displaced away from said first side by said convex shape, each said intermediate contact portion being moved through said surrounding structure by application of a normal force to said central contact portion before any other portions of said plurality of legs are moved through said surrounding structure and before said central contact portion is moved through said surrounding structure.

19. The apparatus of claim 18:

wherein each of said legs of said plurality of legs includes a radially directed portion extending radially outward from said central contact portion and a circumferentially directed portion extending between said radially directed portion and said surrounding structure; and wherein each said intermediate contact portion joins said radially directed portion with each said circumferentially directed portion.

20. Shielding apparatus for enclosing electronic circuits, wherein said shielding apparatus comprises:

a frame including a first surface and first and second flanges extending out from said first surface of said frame; and a cover including a conductive shield extending to form an enclosure, said conductive shield including a generally flat conductive second surface said conductive shield including a plurality of convex dome-shaped contact structures extending to said first and second flanges, said dome-shaped contact structures being positioned along said conductive shield in a spaced-apart relationship, each said dome-shaped contact structure including a central contact portion held in contact with an adjacent one of said first and second flanges by deflection of said contact structure, and a plurality of legs, angularly spaced apart around said central contact portion, extending between said central contact portion and said generally flat conductive second surface, each of said legs of said plurality of legs extending radially outward from said central contact portion and circumferentially partially around said central contact portion.

21. The apparatus of claim 20, wherein each of said legs of said plurality of legs includes:

a radial portion extending from said central contact portion; and a circumferential portion extending between said radial portion and said surrounding flat conductive second surface, said circumferential portions of all of said legs of said plurality of legs within said dome-shaped contact structure extending in a common angular direction between each said radial portion and said generally flat conductive second surface.

22. The apparatus of claim 20, wherein each said dome-shaped contact structure and said generally flat conductive surface are integral parts of said conductive shield.

23. The apparatus of claim 20, wherein each said dome-shaped contact structure and said generally flat conductive second surface are integral parts of spring strips attached to said conductive shield.

24. The apparatus of claim 23, wherein each of said legs of said plurality of legs includes an intermediate contact portion, intermediately placed along each of said legs of said plurality of legs, said intermediate contact portion being held in contact with said conductive shield by contact between said first and second flanges and each said central contact portion.

25. The apparatus of claim 24:

wherein each of said legs of said plurality of legs includes a radially directed portion extending radially outward from said central contact portion and a circumferentially directed portion extending between said radially directed portion and said generally flat conductive second surface; and wherein each said intermediate contact portion joins each said radially directed portion with each said circumferentially directed portion.

26. The apparatus of claim 23, wherein said spring strips are welded to said conductive shield.

27. The apparatus of claim 23, wherein each said spring strip comprises:

a folded region;

a first side extending from said folded region; and a second side extending from said folded region, said first and second sides extending along opposite sides of an edge portion of said conductive shield, said second side including a number of said dome-shaped contact structures.

28. The apparatus of claim 27:

wherein said first side of each said spring strip includes a number of latching portions; and wherein said edge portion of said conductive shield includes a number of apertures into which said latching portions extend.

\* \* \* \* \*